(12) United States Patent
Sugie

(10) Patent No.: US 9,024,558 B2
(45) Date of Patent: May 5, 2015

(54) BRIDGE OUTPUT CIRCUIT, MOTOR DRIVING DEVICE USING THE SAME, AND ELECTRONIC APPARATUS

(71) Applicant: Rohm Co., Ltd., Kyoto (JP)

(72) Inventor: Hisashi Sugie, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 140 days.

(21) Appl. No.: 13/902,106

(22) Filed: May 24, 2013

(65) Prior Publication Data

US 2013/0314020 A1    Nov. 28, 2013

(30) Foreign Application Priority Data

May 28, 2012 (JP) .................... 2012-121277

(51) Int. Cl.
| | |
|---|---|
| *H02P 6/14* | (2006.01) |
| *H03K 3/012* | (2006.01) |
| *H02P 29/00* | (2006.01) |
| *H03K 17/16* | (2006.01) |
| *H02P 6/08* | (2006.01) |

(52) U.S. Cl.
CPC ............ *H03K 3/012* (2013.01); *H02P 29/0038* (2013.01); *H03K 17/165* (2013.01); *H02P 6/085* (2013.01)

(58) Field of Classification Search
USPC ............ 318/400.26, 400.27, 400.28, 400.29; 327/108, 390, 112; 326/88
See application file for complete search history.

(56) References Cited

U.S. PATENT DOCUMENTS

| | | | | |
|---|---|---|---|---|
| 5,668,449 A | * | 9/1997 | Carobolante | ............ 318/400.09 |
| 5,796,276 A | * | 8/1998 | Phillips et al. | ................ 327/108 |

FOREIGN PATENT DOCUMENTS

| | | |
|---|---|---|
| JP | 2004-119022 | 4/2004 |
| JP | 2005-304226 | 10/2005 |

* cited by examiner

*Primary Examiner* — Antony M Paul
(74) *Attorney, Agent, or Firm* — Fish & Richardson P.C.

(57) ABSTRACT

A bridge output circuit includes an output terminal, a high side transistor, a low side transistor, a high side driver for controlling a gate voltage of the high side transistor, a low side driver for controlling a gate voltage of the low side transistor, and a controller for controlling the high side and low side drivers. The low side driver includes a first current source, a second current source, and a first assist circuit. The controller is configured to control the turning-on and turning-off states of the first current source, the second current source and the first assist circuit.

20 Claims, 20 Drawing Sheets

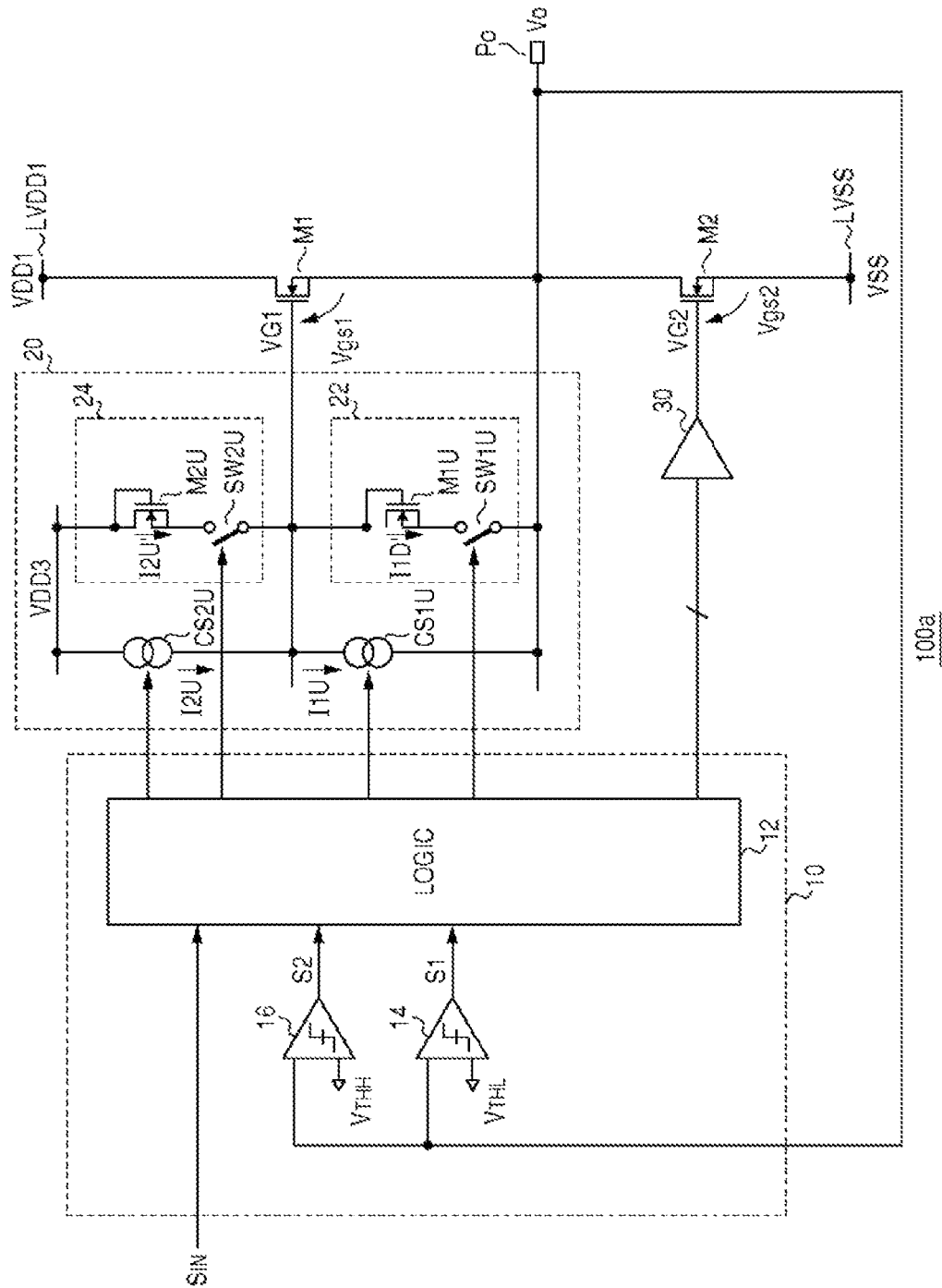

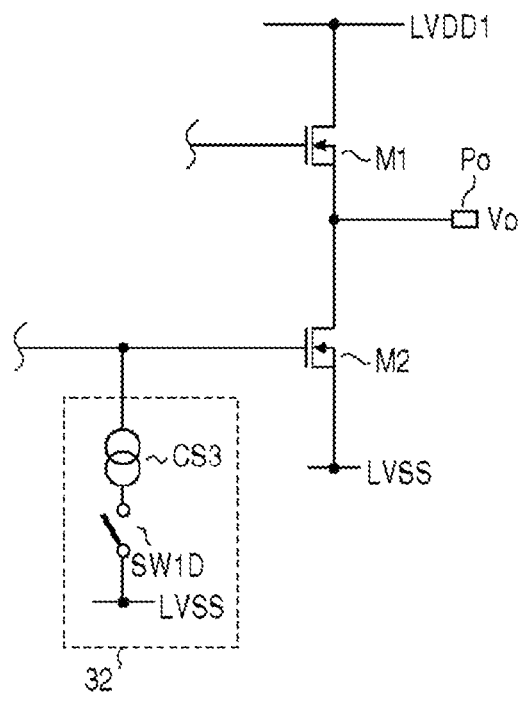 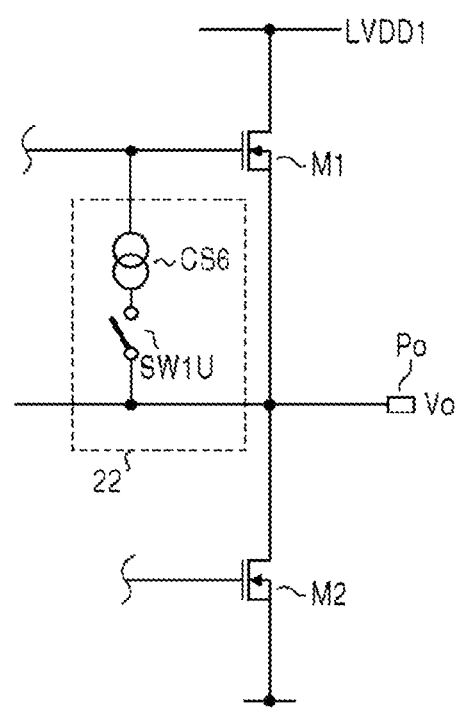

BRIDGE OUTPUT CIRCUIT, MOTOR DRIVING DEVICE USING THE SAME, AND ELECTRONIC APPARATUS

CROSS-REFERENCE TO RELATED APPLICATIONS

This application is based upon and claims the benefit of priority from Japanese Patent Applications No. 2012-121277, filed on May 28, 2012, the entire contents of which are incorporated herein by reference.

TECHNICAL FIELD

The present disclosure relates to a bridge-typed output circuit.

BACKGROUND

Half bridge circuits and H-bridge circuits (hereinafter generally referred to as "bridge output circuits") using power transistors are being widely used for various kinds of electronic circuits. A bridge output circuit includes a high side transistor and a low side transistor connected in series between a power source terminal and a ground terminal When the high side transistor and the low side transistor alternate between a turning-on state and a turning-off state with a dead time being provided therebetween, an output voltage (also called a switching voltage) repeating a power source voltage or a ground voltage is outputted to a load from an output terminal which is a node between the high side transistor and the low side transistor.

A speed of change in a slope of the switching voltage (slew rate) becomes important in the bridge output circuit. In general, if the slew rate is too small, a waveform of the switching voltage becomes to be blunted. Thus, the slew rate is required to have a certain size.

On the other hand, if the slew rate is too large, high frequency components included in the switching voltage are increased. Since the high frequency components act as undesirable noise depending on usage environment of the bridge output circuit, there is a need to restrict the slew rate of the switching voltage within a certain range.

FIG. 1 is a circuit diagram of a conventional bridge output circuit 100r. The bridge output circuit 100r includes a high side transistor M1, a low side transistor M2, an output terminal Po, an upper power line LVDD, a lower power line LVSS, a controller 10r, a high side driver 20r and a low side driver 30r.

The high side transistor M1 and the low side transistor M2 are connected in series between the upper power line LVDD and the lower power line LVSS.

The low side driver 30r applies a gate voltage VG2 assuming a high level voltage V2H or a low level voltage V2L to a gate of the low side transistor M2. The low side driver 30r includes a first current source CS2D and a second current source CS1D. The first current source CS2D and the second current source CS1D are configured to switch between a turning-on state and a turning-off state, independently.

Under a state where the low side transistor M2 is turned off, when the current source CS2D is turned on and the current source CS1D is turned off, a predetermined constant current I2D is supplied to a gate capacitance of the low side transistor M2 and the gate voltage VG2 increases to the high level voltage V2H, thereby turning on the low side transistor M2.

Under a state where the low side transistor M2 is turned on, when the current source CS2D is turned off and the current source CS1D is turned on, a predetermined constant current I1D is drawn from the gate capacitance of the low side transistor M2 and the gate voltage VG2 decreases to the low level voltage V2L, thereby turning off the low side transistor M2.

The high side driver 20r has a same configuration as the low side driver 30r. The high side driver 20r applies a gate voltage VG1 assuming a high level voltage V1H or a low level voltage V1L to a gate of the high side transistor M1, thereby switching the high side transistor M1.

The controller 10r controls an on/off state of current sources of the high side driver 20r and the low side driver 30r based on a control signal $S_{IN}$.

FIG. 2 is a view showing a voltage-current characteristic of the low side transistor M2. FIG. 3 is a waveform diagram showing an operation of the bridge output circuit 100r of FIG. 1. FIG. 3 shows a waveform when an output voltage Vo transitions from a low level voltage VSS (for example, 0V) to a high level voltage VDD (for example, 12V). It is here assumed that a constant current source (not shown) as a virtual load is connected to the output terminal Po and load current Io flows in a direction (sink direction) in which the bridge output circuit 100r absorbs the load current Io. In an initial state, the high side transistor M1 is turned on and the low side transistor M2 is turned off, and the gate voltage VG2 is maintained around the high level voltage V2H (for example, 5V).

At time t0 (at which Period T1 starts), the control signal $S_{IN}$ transitions from a low level to a high level. Upon the transition of the control signal $S_{IN}$, the controller 10r turns off the current source CS2D and turns on the current source CS1D, a gate capacitance (Cgs+Cgd) of the low side transistor M2 is discharged by the current I1D, and the gate voltage VG2 gets lowered (Period T1 in FIG. 3).

When the gate voltage VG2 is lowered to a certain extent, on-resistance Ron of the low side transistor M2 begins to increase and the output voltage Vo (i.e., a drain-source voltage Vds) begins to increase as well (Period T2). This operation corresponds to a linear region I in FIG. 2.

A slew rate of the output voltage Vo is controlled in a subsequent slew rate control period T3. In the slew rate control period T3, the low side transistor M2 is operated in a saturation region II in FIG. 2. When source-drain current Ids is maintained at a constant value Io', the gate voltage VG is changed in a narrow range (referred to as a "slew rate control region (Vslew)" in the specification) around Vgs=1V in the saturation region II in response to a change in the drain-source voltage Vds.

When the load current Io is constant, in order to change the output voltage Vo with a constant slope, there is a need to change on-resistance of the low side transistor M2 with a constant slope. In the slew rate control period T3, the output voltage Vo (Vds) increases with the constant slope, whereas the gate voltage VG2 keeps substantially constant. Accordingly, it is to be noted that a gate-drain capacitance Cgd of the high side transistor M1 is dominant and the current I1D acts on the gate-drain capacitance Cgd.

When the current source CS1D of the low side driver 30 generates the constant current I1D, the gate voltage VG2 is changed such that on-resistance of the high side transistor M1 decreases with a constant slope and, consequently, the output voltage Vo can be changed with a constant slope.

The inventor has reviewed the bridge output circuit 100r and was aware of the following problem.

A range of the load current Io may be dynamically varied depending on a load connected to the bridge output circuit 100r. Accordingly, in the voltage-current characteristic in FIG. 2, the slew rate control region Vslew is heightened if the load current Io is large (for example, 500 mA) and is lowered if the load current Io is small (for example, 100 mA).

FIGS. 4A and 4B are waveform diagrams showing the output voltage Vo and the gate voltage VG2 when the load current Io is 500 mA and 100 mA, respectively. The length of the period T1 is equal to time taken until the gate voltage VG2 decreases from an initial value, i.e., the high level voltage V2H, to around an upper limit of the slew rate control region Vslew. Accordingly, when the load current Io is small and the slew rate control region Vslew is lowered, there rises a problem of prolongation of the period T1 i.e., there may be an increase in a sponse delay of the output voltage Vo to the control signal $S_{IN}$. Such increase in the response delay results in an increased power loss of the bridge output circuit 100r and hence poor efficiency. This problem should not be taken by those skilled in the art as general technical recognition but is one revealed by independent investigation by the inventor. The same problem may be raised in the side of the high side transistor M1.

SUMMARY

The present disclosure provides some embodiments of a bridge output circuit which is capable of reducing a response delay of an output voltage to a control signal while keeping a slew rate of the output voltage constant.

According to one embodiment of the present disclosure, there is provided a bridge output circuit including: an output terminal to be connected to a load; a high side transistor interposed between an upper power line and the output terminal; a low side transistor interposed between the output terminal and a lower power line, the low side transistor being an N-channel MOSFET; a high side driver configured to control a gate voltage of the high side transistor; a low side driver configured to control a gate voltage of the low side transistor; and a controller configured to control the high side driver and the low side driver. The low side driver includes: a first current source configured to switch between a turning-on state and a turning-off state and supply a first predetermined constant current to a gate of the low side transistor in the turning-on state; a second current source configured to switch between the turning-on state and the turning-off state and draw a second predetermined constant current out of the gate of the low side transistor in the turning-on state; and a first assist circuit configured to switch between a turning-on state and the turning-off state and draw the first auxiliary current out of the gate of the low side transistor in the turning-on state, the first assist circuit being provided separately from the second current source. The controller is further configured to control the turning-on state and the turning-off state of the first current source such that, when transitioning an output voltage of the output terminal from a low level voltage to a high level voltage in a state where a load current flows from the output terminal in a direction in which the load current is absorbed into the bridge output circuit, the bridge output circuit (1) goes to a first state where the first current source is turned off and the first assist circuit is turned on, and (2) transition to a second state where the first current source is turned off, the second current source is turned on and the first assist circuit is turned off when the output voltage exceeds a predetermined lower threshold voltage.

The controller rapidly decreases the gate voltage of the low side transistor in a previous stage by using the first assist circuit in the first state before the slew rate control begins. Then, by comparing the output voltage with the predetermined lower threshold voltage, it is detected that the gate voltage decreases to reach a slew rate control region. In addition, by controlling the gate voltage by using the first current source with the first assist circuit being turned off, it is possible to change the output voltage with a constant slope in response to the amount of current generated by the first current source. With this configuration, it is possible to reduce a delayed response of the output voltage to a control signal while keeping the slew rate of the output voltage constant.

The first assist circuit may include a first switch interposed between the gate of the low side transistor and the lower power line. The controller may switch the first switch between the turning-on state and the turning-off state.

The first assist circuit may further include a first transistor which is a MOSFET (Metal Oxide Semiconductor Field Effect Transistor). The first transistor is connected in series to the first switch to be interposed between the gate of the low side transistor and the lower power line and has a gate and a drain connected in common The first assist circuit may include a current source which is interposed between the gate of the low side transistor and the lower power line and is configured to switch between the turning-on state and the turning-off state.

The controller may include a first voltage monitoring unit configured to compare the output voltage with the predetermined lower threshold voltage.

The first voltage monitoring unit may include a second transistor which is an N-channel MOSFET. The second transistor has a source connected to the lower power line and a gate to which the output voltage is applied, and a pull-up resistor which is interposed between a drain of the second transistor and a predetermined voltage line and outputs a signal based on a drain voltage of the second transistor as a detection signal indicating a result of the voltage comparison.

The low side driver may include a second assist circuit configured to switch between the turning-on state and the turning-off state and supply a second auxiliary current to the gate of the low side transistor in the turning-on state, the second assist circuit being provided separately from the first current source. The controller may be further configured to control the turning-on state and the turning-off state of the second assist circuit in addition to the first current source, the second current source and the first assist circuit.

According to another embodiment of the present disclosure, there is provided a bridge output circuit including: an output terminal to be connected to a load; a high side transistor interposed between an upper power line and the output terminal, the high side transistor being an N-channel MOSFET; a low side transistor interposed between the output terminal and a lower power line; a high side driver configured to control a gate voltage of the high side transistor; a low side driver configured to control a gate voltage of the low side transistor; and a controller configured to control the high side driver and the low side driver. The high side driver includes: a third current source configured to switch between a turning-on state and a turning-off state and supply a first predetermined constant current to a gate of the high side transistor in the turning-on state; a fourth current source configured to switch between the turning-on state and the turning-off state and draw a second predetermined constant current out of the gate of the high side transistor in the turning-on state; and a third assist circuit configured to switch between the turning-on state and the turning-off state and draw a first auxiliary current out of the gate of the high side transistor in the turning-on state, the third assist circuit being provided separately from the fourth current source. The controller is configured to control the turning-on state and the turning-off state of the third current source such that, when transitioning an output voltage of the output terminal from a high level voltage to a low level voltage in a state where load current flows from the output terminal in a direction in which the load current is discharged to the load, the bridge output circuit (1) goes to a first state where the third current source is turned off and the third assist circuit is turned on, and (2) transitions to a second state where the third current source is turned off, the fourth current source is turned on and the third assist circuit is turned off when the output voltage is lower than a predetermined upper threshold voltage.

The controller rapidly decreases the gate voltage of the low side transistor in a previous stage by using the third assist circuit in the first state before the slew rate control begins. Then, by comparing the output voltage with the predetermined upper threshold voltage, it is detected that the gate voltage increases to reach a slew rate control region. In addition, by controlling the gate voltage by using the first current source with the first assist circuit being turned off, it is possible to change the output voltage with a constant slope in response to the amount of current generated by the third current source. With this configuration, it is possible to reduce a delayed response of the output voltage to a control signal while keeping the slew rate of the output voltage constant.

The third assist circuit may include a second switch interposed between the gate of the high side transistor and the output terminal The controller may switch the second switch between the turning-on state and the turning-off state.

The third assist circuit may further include a third transistor which is a MOSFET (Metal Oxide Semiconductor Field Effect Transistor). The third transistor is connected in series to the second switch to be disposed between the gate of the high side transistor and the output terminal and has a gate and a drain connected in common.

The third assist circuit may include a current source which is interposed between the gate of the high side transistor and the output terminal and is configured to switch between the turning-on state and the turning-off state.

The controller may include a second voltage monitoring unit configured to compare the output voltage with the predetermined upper threshold voltage.

The second voltage monitoring unit may include a fourth transistor which is a P-channel MOSFET. The fourth transistor has a source connected to the upper power line and a gate to which the output voltage is applied, and a pull-down resistor which is interposed between a drain of the fourth transistor and a predetermined voltage line and output a signal based on a drain voltage of the fourth transistor as a detection signal indicating a result of the voltage comparison.

The high side driver may include a fourth assist circuit configured to switch between the turning-on state and the turning-off state and supply a second auxiliary current to the gate of the high side transistor in the turning-on state, the fourth assist circuit being provided separately from the third current source. The controller may be configured to control the turning-on state and the turning-off state of the fourth assist circuit in addition to the third current source, the fourth current source and the third assist circuit.

According to another embodiment of the present disclosure, there is provided a bridge output circuit including: an output terminal to be connected to a load; a high side transistor interposed between an upper power line and the output terminal, the high side transistor being a P-channel MOSFET; a low side transistor interposed between the output terminal and a lower power line; a high side driver configured to control a gate voltage of the high side transistor; a low side driver configured to control a gate voltage of the low side transistor; and a controller configured to control the high side driver and the low side driver. The high side driver includes:

a fifth current source configured to switch between a turning-on state and a turning-off state and supply a first predetermined constant current to a gate of the high side transistor in the turning-on state; a sixth current source configured to switch between the turning-on state and the turning-off state and draw a second predetermined constant current out of the gate of the high side transistor in the turning-on state; and a fifth assist circuit configured to switch between the turning-on state and the turning-off state and draw a first auxiliary current out of the gate of the high side transistor in the turning-on state, the fifth assist circuit being provided separately from the fifth current source. The controller is further configured to control the turning-on state and the turning-off state of the fifth current source, the sixth current source and the fifth assist circuit such that, when transitioning an output voltage of the output terminal from a high level voltage to a low level voltage in a state where load current flows from the output terminal in a direction in which the load current is discharged to the load, the bridge output circuit (1) goes to a first state where the sixth current source is turned off and the fifth assist circuit is turned on, and (2) transitions to a second state where the sixth current source is turned off, the fifth current source is turned on and the fifth assist circuit is turned off when the output voltage is lower than a predetermined upper threshold voltage.

The controller rapidly decreases the gate voltage of the high side transistor in a previous stage by using the fifth assist circuit in the first state before the slew rate control begins. Then, by comparing the output voltage with the predetermined upper threshold voltage, it is detected that the gate voltage increases to reach a slew rate control region. In addition, by controlling the gate voltage by using the fifth current source with the fifth assist circuit being turned off, it is possible to change the output voltage with a constant slope in response to the amount of current generated by the fifth current source. With this configuration, it is possible to reduce a delay of a response of the output voltage to a control signal while keeping the slew rate of the output voltage constant.

The fifth assist circuit may include a third switch interposed between the gate of the high side transistor and the upper power line. The controller may switch the third switch between the turning-on state and the turning-off state.

The fifth assist circuit may further include a fifth transistor which is a MOSFET (Metal Oxide Semiconductor Field Effect Transistor). The fifth transistor is connected in series to the third switch to be disposed between the gate of the high side transistor and the upper power line and has a gate and a drain connected in common.

The fifth assist circuit may include a current source which is interposed between the gate of the high side transistor and the upper power line and is configured to switch between the turning-on state and the turning-off state.

The controller may include a second voltage monitoring unit configured to compare the output voltage with the predetermined upper threshold voltage.

The second voltage monitoring unit may include a fourth transistor which is a P-channel MOSFET. The fourth transistor has a source connected to the upper power line and a gate to which the output voltage is applied, and a pull-down resistor which is interposed between a drain of the fourth transistor and a predetermined voltage line and output a signal based on a drain voltage of the fourth transistor as a detection signal indicating a result of the voltage comparison.

The high side driver may further include a sixth assist circuit configured to switch between the turning-on state and the turning-off state and draw a second auxiliary current out of the gate of the high side transistor in the turning-on state, the sixth assist circuit being provided separately from the sixth current source. The controller may be configured to control the turning-on state and the turning-off state of the sixth assist circuit in addition to the fifth current source, the sixth current source and the fifth assist circuit.

According to another embodiment of the present disclosure, there is provided a motor driving device including any of the above-described bridge output circuits.

According to another embodiment of the present disclosure, there is provided an electronic apparatus including: a motor; and a motor driving device configured to drive the motor. The motor driving device includes any of the above-described bridge output circuits.

Any combinations of the above-described elements and mutual substitution of elements and expressions of the present disclosure between a method, an apparatus, a system and the like can be effectively used as other embodiments of the present disclosure.

BRIEF DESCRIPTION OF THE DRAWINGS

FIG. 6 is another circuit diagram of the bridge output circuit according to the embodiment.

FIGS. 16A to 16C are circuit diagrams showing a modification of first, third and fifth assist circuits.

DETAILED DESCRIPTION

Figure 1:
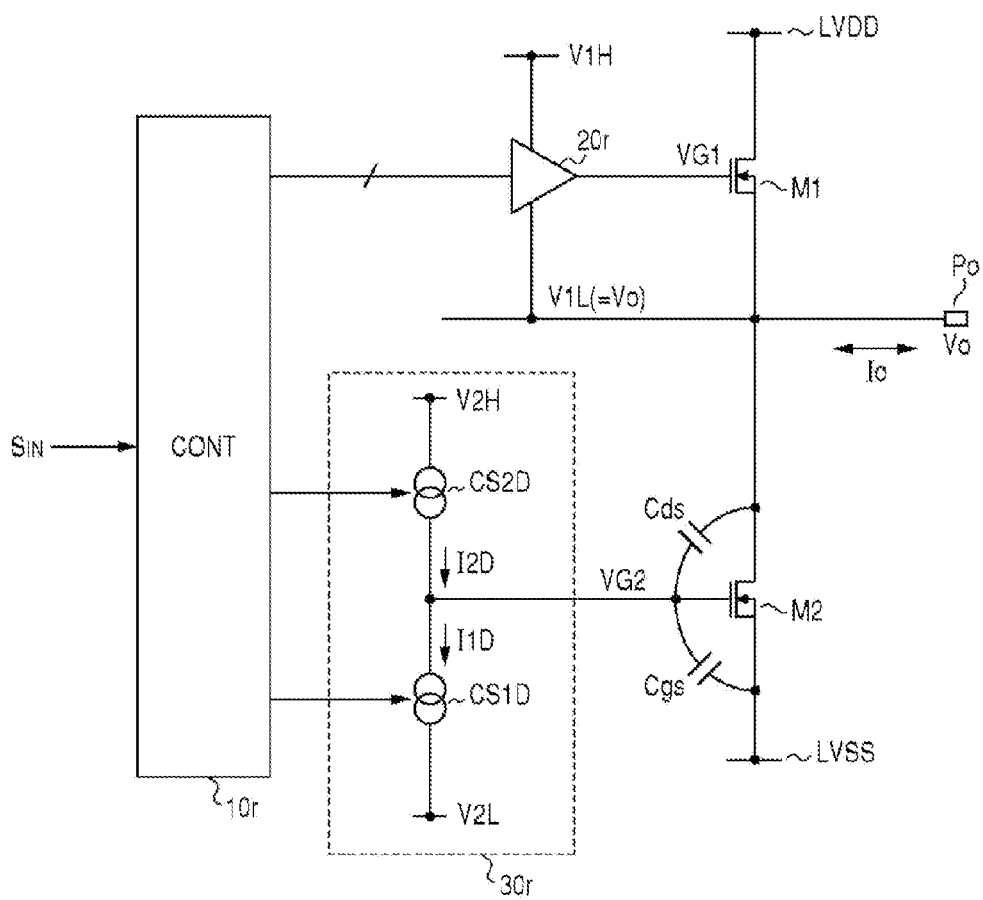
FIG. 1 is a circuit diagram of a conventional bridge output circuit.
Figure 2:
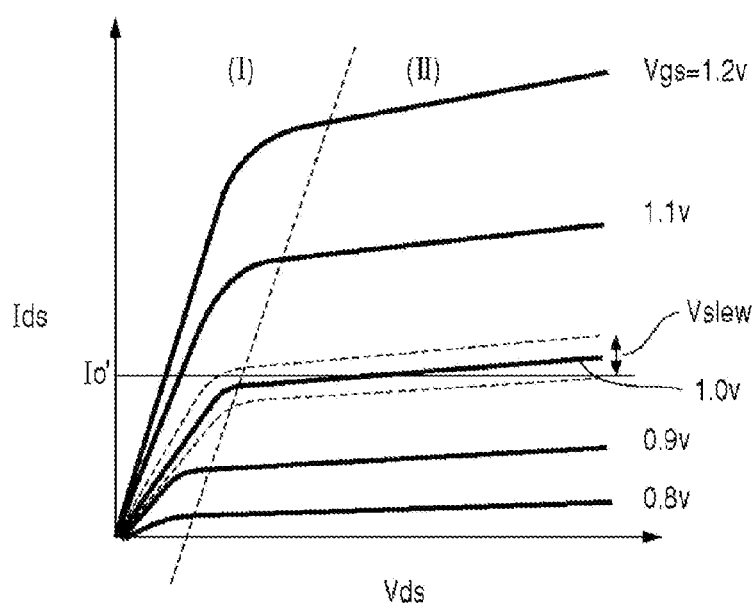
FIG. 2 is a view showing a voltage-current characteristic of a low side transistor.
Figure 3:
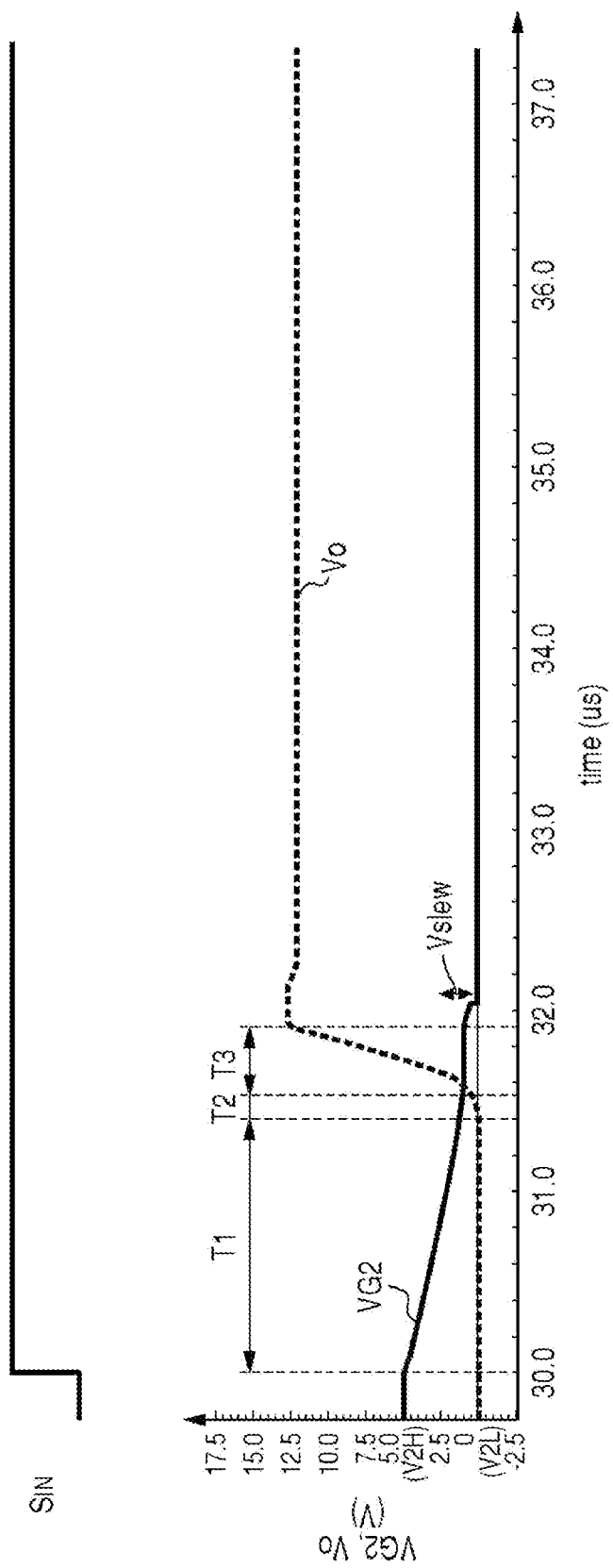
FIG. 3 is a waveform diagram showing an operation of the bridge output circuit of FIG. 1.
Figure 4A:
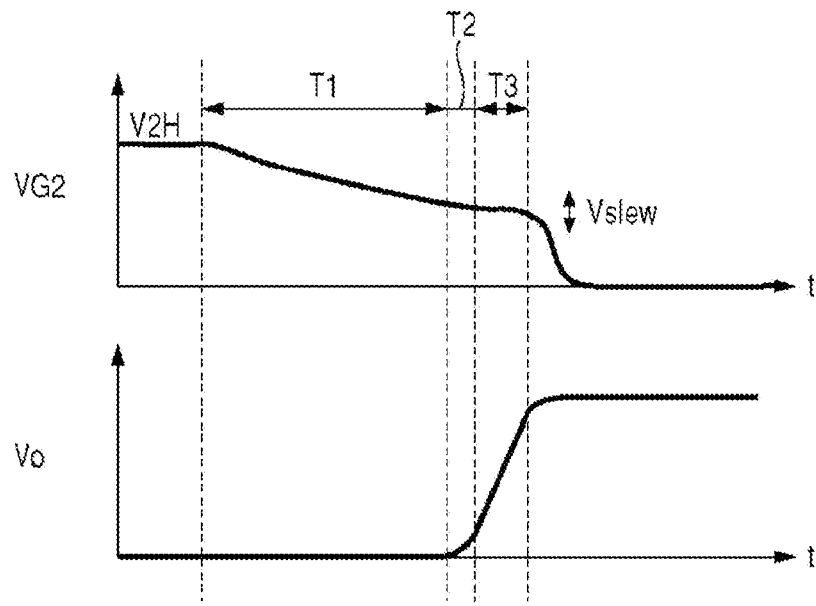
FIGS. 4A and 4B are waveform diagrams showing an output voltage and a gate voltage when load current Io is 500 mA and 100 mA, respectively.
Figure 4B:
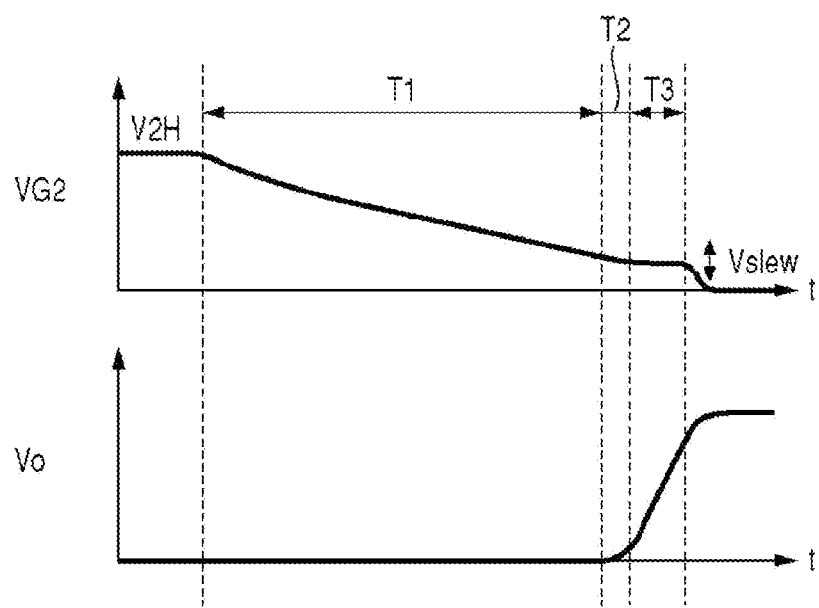

Some embodiments of the present disclosure will now be described in detail with reference to the drawings. Throughout the drawings, the same or similar elements, members and processes are denoted by the same reference numerals and explanation of which will not be repeated. The disclosed embodiments are provided for the purpose of illustration, not limitation, of the present disclosure and all features and combinations thereof described in the embodiments cannot be necessarily construed to describe the spirit of the present disclosure.

In the specification, the phrase "connection of a member A and a member B" is intended to include direct physical connection of the member A and the member B as well as indirect connection thereof via other member as long as the other member has no substantial effect on the electrical connection of the member A and the member B or has no damage to functions and effects shown by a combination of the member A and the member B. Similarly, the phrase "interposition of a member C between a member A and a member B" is intended to include direct connection of the member A and the member C or direct connection of the member B and the member C as well as indirect connection thereof via other member as long as the other member has no substantial effect on the electrical connection of the member A, the member B and the member C or has no damage to functions and effects shown by a combination of the member A, the member B and the member C.

Figure 5:
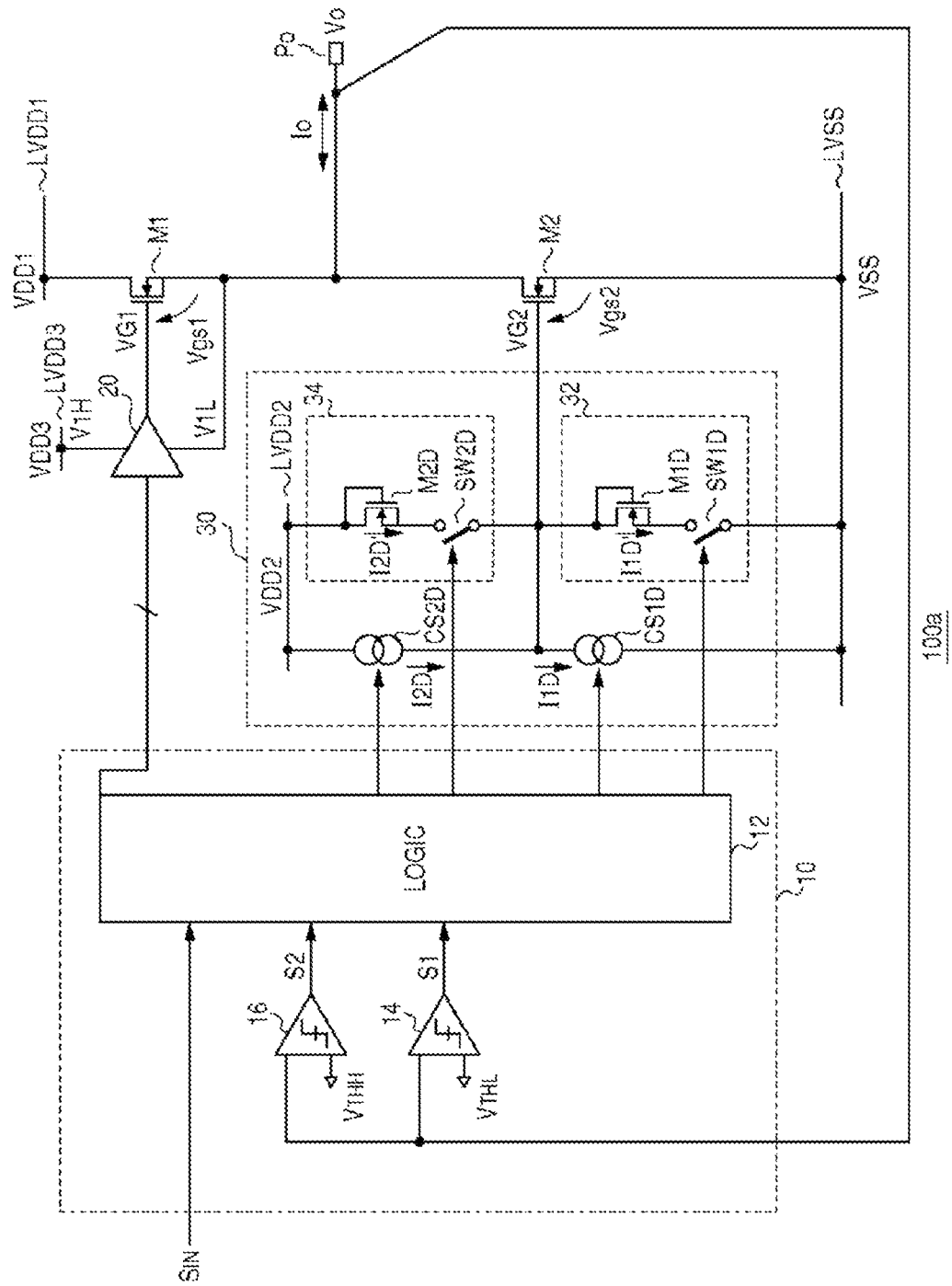
FIG. 5 is a circuit diagram of a bridge output circuit according to an embodiment.

FIGS. 5 and 6 are circuit diagrams of a bridge output circuit 100a according to an embodiment of the present disclosure. The bridge output circuit 100a receives a control signal $S_{IN}$ and outputs an output voltage Vo through an output terminal Po based on a level of the control signal $S_{IN}$. In this embodiment, the output voltage Vo assumes a high level voltage VDD1 (for example, 12V) when the control signal $S_{IN}$ has a high level, whereas an output signal $S_{OUT}$ assumes a ground voltage VSS (for example, 0V) when the control signal $S_{IN}$ has a low level The bridge output circuit 100a includes the output terminal Po, a high side transistor M1, a low side transistor M2, a high side driver 20, a low side driver 30, and a controller 10. A load (not shown) is connected to the output terminal Po. The high side transistor M1 is an N-channel MOSFET and is interposed between the output terminal Po and an upper power line LVDD1 to which a power source voltage VDD1 is applied. The low side transistor M2 is an N-channel MOSFET and is interposed between the output terminal Po and a lower power line LVSS to which a ground voltage VSS is applied.

The high side driver 20 controls a gate voltage VG1 of the high side transistor M1. More specifically, the high side driver 20 outputs a high level voltage VDD3 (for example, 17V) when turning on the high side transistor M1 and outputs a low level voltage (for example, the output voltage Vo) when turning off the high side transistor M1.

The low side driver 30 controls a gate voltage VG2 of the low side transistor M2. More specifically, when the low side transistor M2 is turned on, the low side driver 30 outputs a high level voltage VDD2 (for example, 5V), and when the low side transistor M2 is turned off, the low side driver 30 outputs a low level voltage (for example, the ground voltage).

The controller 10 controls the high side driver 20 and the low side driver 30 according to the control signal $S_{IN}$.

Subsequently, a configuration of the low side driver 30 will be described with reference to FIG. 5. The low side driver 30 includes a first current source CS2D, a second current source CS1D, a first assist circuit 32 and a second assist circuit 34.

The first current source CS2D is configured to switch between a turning-on state and a turning-off state and supplies a predetermined constant current I2D to a gate of the low side transistor M2 in the turning-on state. The second current source CS1D is configured to switch between the turning-on state and the turning-off state and draws a predetermined constant current I1D out of the gate of the low side transistor M2 in the turning-on state.

The first assist circuit 32 is provided separately from the second current source CS1D and is configured to switch between a turning-on state and a turning-off state. The first assist circuit 32 draws an auxiliary current I1D' out of the gate of the low side transistor M2 in the turning-on state. The amount of the auxiliary current I1D' is preferably greater than the amount of the current I1D of the second current source CS1D.

For example, the first assist circuit 32 includes a first switch SW1D interposed between the gate of the low side transistor M2 and the lower power line LVSS. The controller 10 switches the first switch SW1D between a switch-on state and a switch-off state. When the first switch SW1D is switched on, charges in the gate of the low side transistor M2 can be discharged via the first switch SW1D.

The first assist circuit 32 of FIG. 5 further includes a first transistor M1D, which is an N-channel MOSFET (Metal Oxide Semiconductor Field Effect Transistor), interposed in series to the first switch SW1D between the gate of the low side transistor M2 and the lower power line LVSS. A gate and a drain of the first transistor MID are connected in common With this configuration, when the first switch SW1D is in the switch-on state, it is possible to generate the auxiliary current I1D' according to characteristics of the first transistor M1D. In addition, the first switch SW1D and the first transistor M1D may be interchanged.

The second assist circuit 34 is provided separately from the first current source CS2D and is configured to switch between a turning-on state and a turning-off state. The second assist circuit 34 supplies an auxiliary current I2D' to the gate of the low side transistor M2 in the turning-on state. For example, the second assist circuit 34 includes a switch SW2D and a transistor M2D.

The controller 10 controls the turning-on state and the turning-off state of the first current source CS2D, the second current source CS1D, the first assist circuit 32 and the second assist circuit 34.

Subsequently, a configuration of the high side driver 20 will be described with reference to FIG. 6. The high side driver 20 includes a third current source CS2U, a fourth current source CS2U, a third assist circuit 22 and a fourth assist circuit 24.

The third current source CS2U is configured to switch between the turning-on state and the turning-off state and supplies a predetermined constant current I2U to a gate of the high side transistor M1 in the turning-on state. The fourth current source CS1U is configured to switch between the turning-on state and the turning-off state and draws a predetermined constant current I1U out of the gate of the high side transistor M1 in the turning-on state.

The third assist circuit 22 is provided separately from the fourth current source CS1U and is configured to switch between a turning-on state and a turning-off state. The third assist circuit 22 draws an auxiliary current I1U' out of the gate of the high side transistor M1 in the turning-on state. The amount of the auxiliary current I1D' is preferably greater than the amount of the current I1U of the fourth current source CS1U.

The third assist circuit 22 includes a second switch SW1U and a third transistor MIU and has the same configuration as the first assist circuit 32 of FIG. 5.

The fourth assist circuit 24 is provided separately from the third current source CS2U and is configured to switch between a turning-on state and a turning-off state. The fourth assist circuit 24 supplies an auxiliary current I2U' to the gate of the high side transistor M1 in the turning-on state. The fourth assist circuit 24 includes a switch SW2U and a transistor M2U and has the same configuration as the second assist circuit 34 of FIG. 5.

The controller 10 is configured to control the turning-on state and the turning-off state of the third current source CS2U, the fourth current source CS1U, the third assist circuit 22 and the fourth assist circuit 24.

Subsequently, a configuration of the controller 10 will be described. The controller 10 includes a logic unit 12, a first voltage monitoring unit 14 and a second voltage monitoring unit 16.

The first voltage monitoring unit 14 compares the output voltage Vo with a predetermined lower threshold voltage $V_{THL}$. The threshold voltage $V_{THL}$ is set to a lower limit of a voltage range for controlling a slew rate of the output voltage Vo. For example, the threshold voltage $V_{THL}$ is about 1.5V.

The second voltage monitoring unit 16 compares the output voltage Vo with an upper threshold voltage $V_{THH}$. The threshold voltage $V_{THH}$ is set to an upper limit of the voltage range for controlling the slew rate of the output voltage Vo. For example, the threshold voltage $V_{THH}$ is about 10.5V.

Figure 7A:
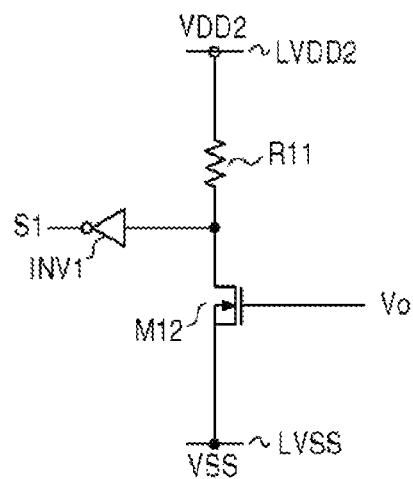
FIGS. 7A and 7B are circuit diagrams showing examples of configurations of a first voltage monitoring unit and a second voltage monitoring unit.
Figure 7B:
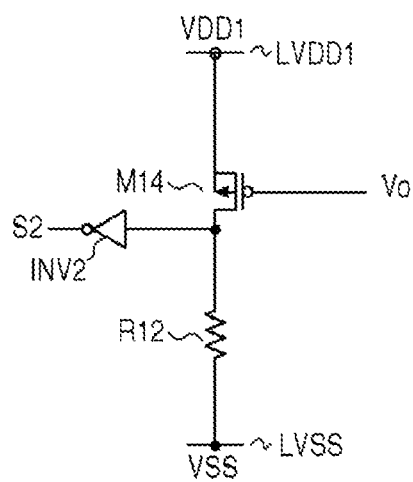

FIGS. 7A and 7B are circuit diagrams showing examples of configurations of the first voltage monitoring unit 14 and the second voltage monitoring unit 16. The first voltage monitoring unit 14 of FIG. 7A includes a second transistor M12 and a pull-up resistor R11. The second transistor M12 is an N-channel MOSFET having a source connected to the lower power line LVSS and a gate to which the output voltage Vo is applied. The pull-up resistor R11 is interposed between a drain of the second transistor M12 and a predetermined voltage line (for example, LVDD2).

The first voltage monitoring unit 14 outputs a signal based on a drain voltage of the second transistor M12 as a detection signal S1 indicating a result of the voltage comparison. The detection signal S1 takes a first level (for example, a low level) if Vo<$V_{THL}$ and takes a second level (for example, a high level) if Vo>$V_{THL}$. Allocation of the high level and the low level may be changed depending on a design consideration. An inverter INV1 inverts the drain voltage to generate the detection signal S1.

In the first voltage monitoring unit 14 of FIG. 7A, a gate-source threshold voltage $V_{th}$ of the MOSFET corresponds to the threshold voltage $V_{THL}$.

The second voltage monitoring unit 16 of FIG. 7B includes a fourth transistor M14 and a pull-down resistor R12. The fourth transistor M14 is a P-channel MOSFET having a source connected to the upper power line LVSS1 and a gate to which the output voltage Vo is applied. The pull-down resistor R12 is interposed between a drain of the fourth transistor M14 and a predetermined voltage line (for example, LVSS). The second voltage monitoring unit 16 outputs a signal based on a drain voltage of the fourth transistor M14 as a detection signal S2 indicating a result of the voltage comparison. The detection signal S2 takes a first level (for example, a low level) if Vo<$V_{THH}$ and takes a second level (for example, a high level) if Vo>$V_{THH}$. Allocation of the high level and the low level may be changed depending on a design consideration. An inverter INV2 inverts the drain voltage to generate the detection signal S2.

In the second voltage monitoring unit 16 of FIG. 7B, VDD1−Vth corresponds to the threshold voltage $V_{THH}$. Here, Vth represents a gate-source threshold voltage of the MOSFET.

Each of the first voltage monitoring unit 14 and the second voltage monitoring unit 16 may be configured as a voltage comparator including a differential amplifier.

The logic unit 12 controls the high side driver 20 and the low side driver 30 based on the control signal $S_{IN}$ and the detection signals S1 and S2.

Subsequently, an operation of the bridge output circuit 100a will be described.

If an inductive load (not shown) such as a motor or the like is coupled to the output terminal Po, there exist (1) a sink state where a load current Io is absorbed from the load into the bridge output circuit 100a and (2) a source state where the load current Io is flowing toward the load. In addition, each state has (a) a case where the control signal $S_{IN}$ transitions from a low level to a high level and (b) a case where the control signal $S_{IN}$ transitions from a high level to a low level. As a result, there exist four state transitions in the controller 10 as follows:

First transition: transition of the control signal $S_{IN}$ from the low level to the high level in the sink state Second transition: transition of the control signal $S_{IN}$ from the low level to the high level in the source state Third transition: transition of the control signal $S_{IN}$ from the high level to the low level in the source state Fourth transition: transition of the control signal $S_{IN}$ from the high level to the low level in the sink state (First Transition)

Figure 8:
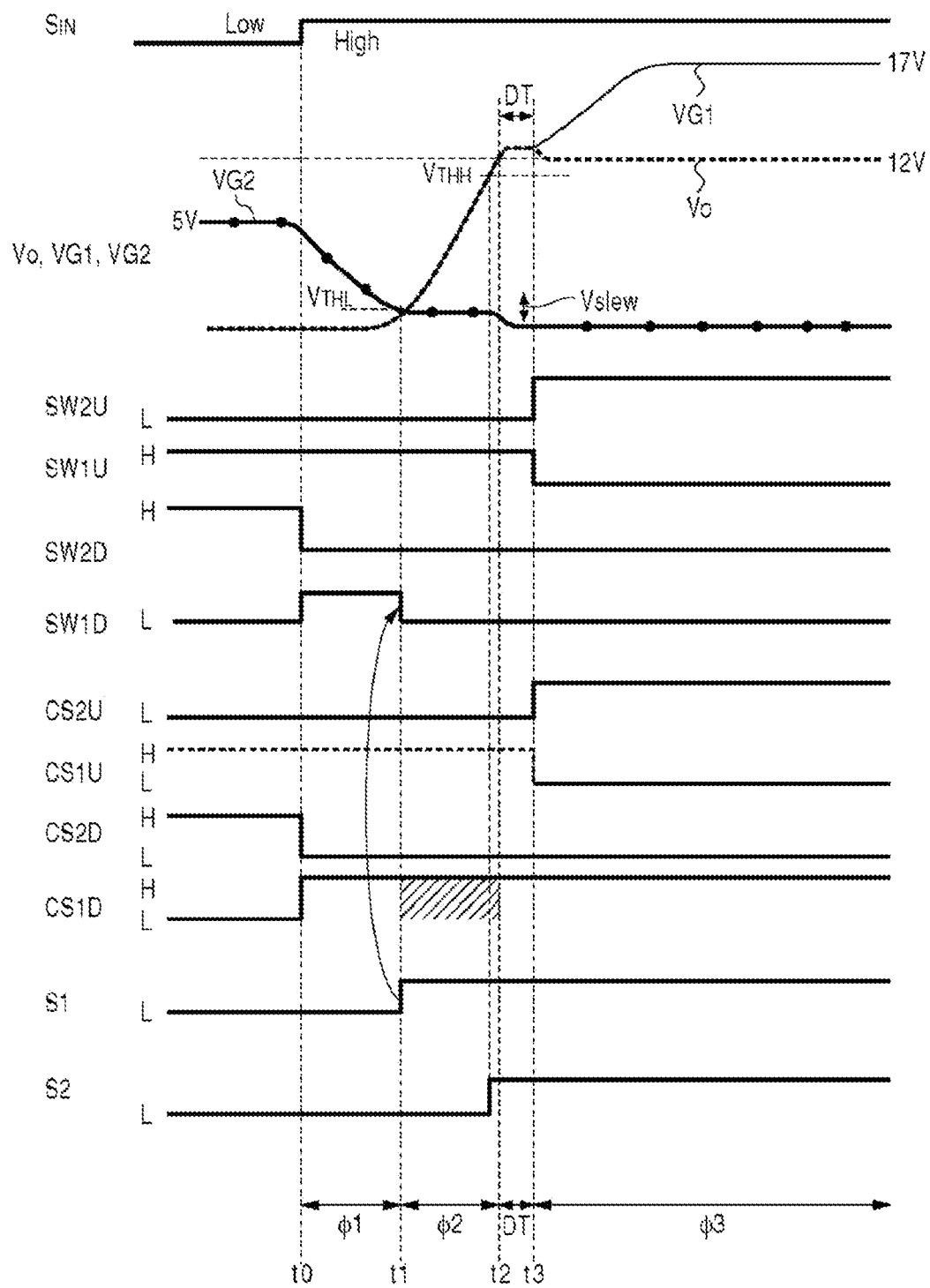
FIG. 8 is a waveform diagram showing an operation of a controller in a first transition.

FIG. 8 is a waveform diagram showing an operation of the controller 10 in the first transition. In an initial state φ0, the gate voltage VG1 is maintained at a low level voltage Vo and the high side transistor M1 is in the turning-off state. In addition, the gate voltage VG2 is maintained at a high level voltage VDD2 and the low side transistor M2 is in the turning-on state. In the initial state φ0, the controller 10 turns on the first current source CS2D and the switch SW2D in order to maintain the gate voltage VG2 as a high level. In FIGS. 8 to 11, redundant signals which may have either a high level or a low level are indicated by dotted lines.

When the control signal $S_{IN}$ transitions to the high level at time t0, the controller 10 turns off the first current source CS2D and the switch SW2D and transitions to a first state φ1. In the first state φ1, the controller 10 turns on the first current source CS2D and the switch SW2D. At this time, the second current source CS1D may be turned off.

In the first state φ1, the current ID1' is drawn from the gate of the low side transistor M2 mainly by the first assist circuit 32 and the gate voltage VG2 is decreased. Then, the output voltage Vo begins to rise.

At time t1, when Vo>$V_{THL}$, the detection signal 51 transitions to a high level and also transitions to a second state φ2. In the second state φ2, the controller 10 turns off the first switch SW 1D (or the first assist circuit 32). As a result, the gate voltage VG2 of the low side transistor M2 is controlled by the current I1D generated by the second current source CS1D (slew rate control). In the end, the output voltage Vo rises with a certain slope. In FIG. 8, a period for which the slew rate control is performed is hatched.

At time t2, when it is detected that the low side transistor M2 is completely turned off, the controller 10 transitions to the dead time DT accordingly. For the dead time DT, the high side transistor M1 and the low side transistor M2 are turned off. For the dead time DT, the load current Io flows into a body diode (not shown) of the high side transistor M1 and the output voltage Vo becomes equal to about VDD1+Vf. Here, Vf refers to a forward voltage of the body diode.

At time t3 after lapse of the dead time DT, the controller 10 transitions to a third state φ3. In the third state φ3, the controller 10 turns on the third current source CS2U and the switch SW2U and increases a gate-source voltage Vgs1 of the high side transistor M1. As a result, the high side transistor M1 is turned on.

(Second Transition)

Figure 9:
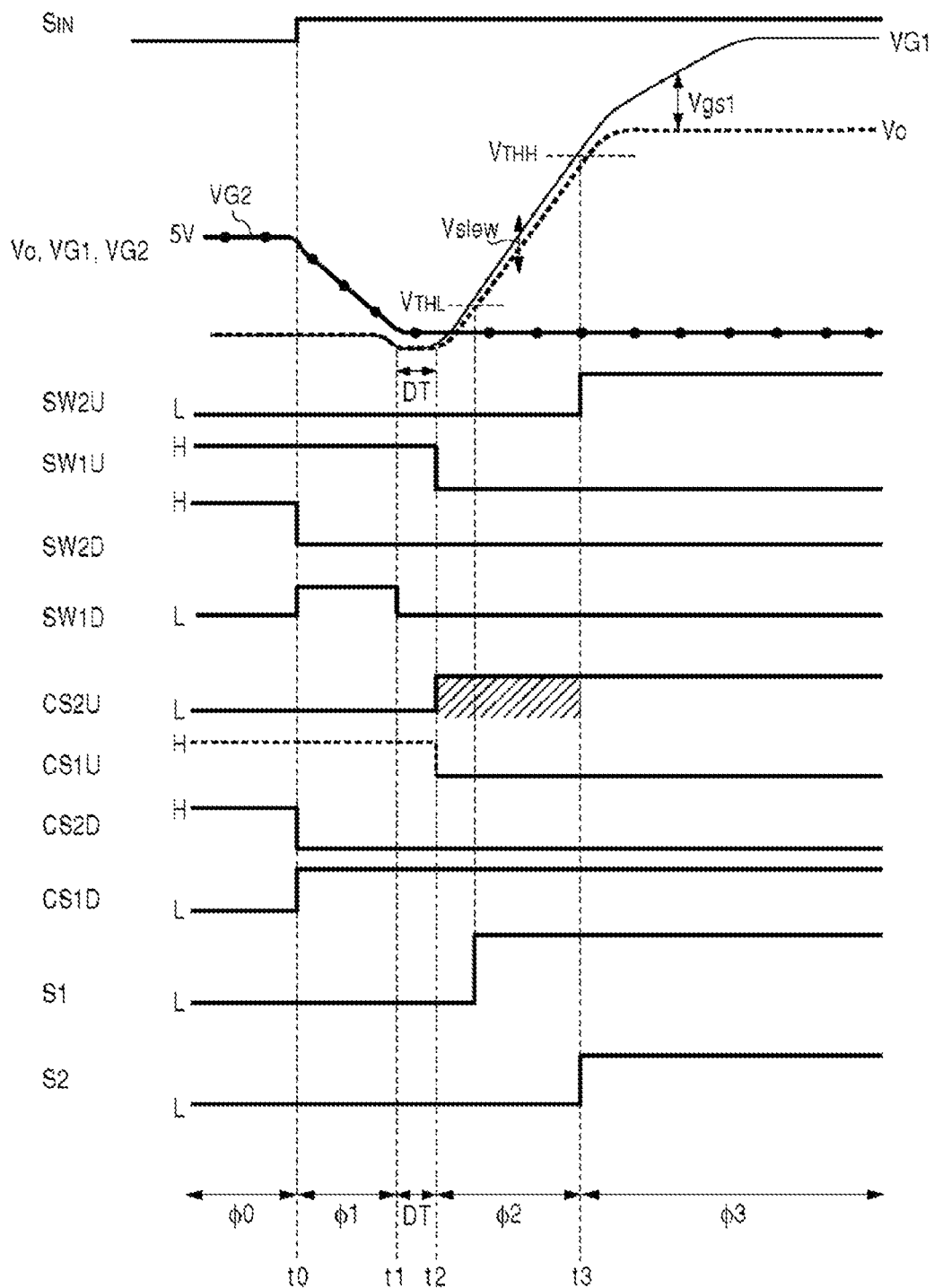
FIG. 9 is a waveform diagram showing an operation of a controller in a second transition.

FIG. 9 is a waveform diagram showing an operation of the controller 10 in the second transition. In an initial state φ0, the gate voltage VG1 is maintained at a low level voltage Vo and the high side transistor M1 is in the turning-off state. In addition, the gate voltage VG2 is maintained at a high level voltage VDD2 and the low side transistor M2 is in the turning-on state. In the initial state φ0, the controller 10 turns on the first current source CS2D and the switch SW2D in order to maintain the gate voltage VG2 as a high level.

When the control signal $S_{IN}$ transitions to the high level at time t0, the controller 10 turns off the first current source CS2D and the switch SW2D and transitions to a first state φ1. In the first state 100 1, the controller 10 turns on the second current source CS1D and the first switch SW1D. At this time, the second current source CS1D may be turned off.

In the first state 100 1, the current ID1' is drawn from the gate of the low side transistor M2 mainly by the first assist circuit 32 and the gate voltage VG2 is decreased. At this time, the output voltage Vo is kept at a low level voltage.

At time t1, when it is detected that the low side transistor M2 is completely turned off, the controller 10 transitions to the dead time DT accordingly. For the dead time DT, a load current Io flows into a body diode (not shown) of the low side transistor M2 and the output voltage Vo becomes accordingly equal to −Vf. Here, Vf refers to a forward voltage of the body diode.

At time t2 after lapse of the dead time DT, the controller 10 transitions to a second state φ2. In the second state φ2, the third current source CS2U is turned on. This allows a difference between the gate voltage VG1 and the source voltage (the output voltage Vo) of the high side transistor M1 (i.e., the gate-source voltage Vgs1 of the high side transistor M1) to be controlled by the current I2U (slew rate control). As a result, the output voltage Vo rises with a certain slope. In FIG. 9, a period for which the slew rate control is performed is hatched.

When the output voltage Vo exceeds the threshold voltage $V_{THH}$ at time t3, the detection signal S2 goes to a high level and transitions to a third state φ3. In the third state φ3, the controller 10 rapidly increases the gate voltage VG1 with the fourth assist circuit 24 (or the switch SW2U) turned on.

(Third Transition)

Figure 10:
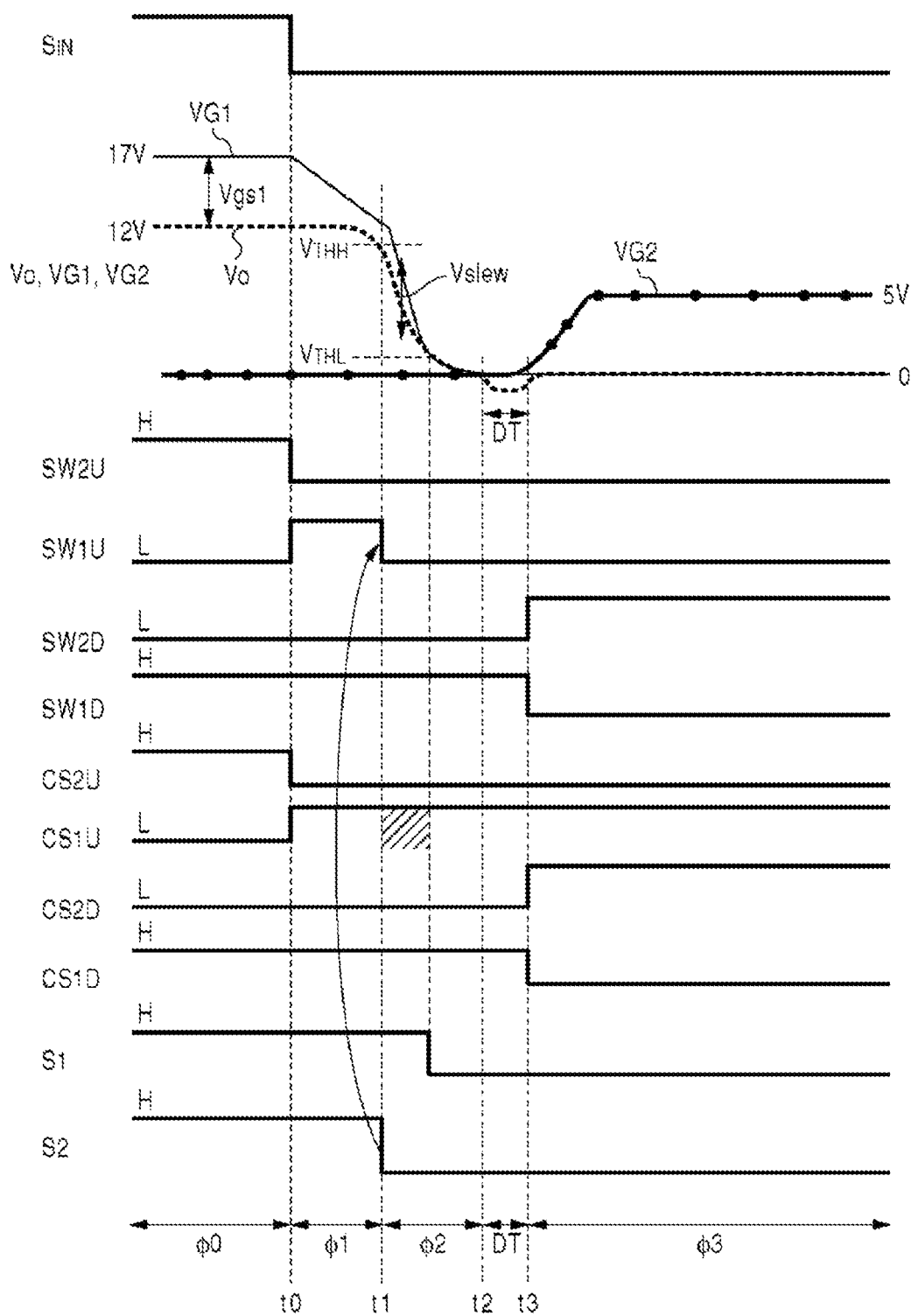
FIG. 10 is a waveform diagram showing an operation of a controller in a third transition.

FIG. 10 is a waveform diagram showing an operation of the controller 10 in the third transition. In an initial state φ0, the gate voltage VG1 is maintained at a low level voltage Vo and the high side transistor M1 is in the turning-off state. In addition, the gate voltage VG2 is maintained at a low level voltage VSS and the low side transistor M2 is in the turning-off state. In the initial state φ0, the controller 10 turns on the third current source CS2U and the switch SW2U in order to maintain the gate voltage VG1 as a high level.

When the control signal $S_{IN}$ transitions to the low level at time t0, the controller 10 turns off the third current source CS2U and the switch SW2U and transitions to a first state φ1. In the first state φ1, the controller 10 turns on the fourth current source CS1U and the second switch SW1U. At this time, the fourth current source CS1U may be turned off.

In the first state φ1, the current ID1' is drawn from the gate of the high side transistor M1 mainly by the third assist circuit 22 and the gate voltage VG1 is decreased. At this time, the output voltage Vo begins to decrease.

At time t1, when Vo <$V_{THH}$, the detection signal S2 transitions to a low level and also transitions to a second state φ2.

In the second state φ2, the controller 10 turns off the second switch SW1U (or the third assist circuit 22). As a result, the gate-source voltage Vgs1 of the high side transistor M1 is controlled by the current I1U generated by the fourth current source CS1U (slew rate control). In the end, the output voltage Vo drops with a certain slope. In FIG. 10, a period for which the slew rate control is performed is hatched.

At time t2, when it is detected that the high side transistor M1 is completely turned off, the controller 10 transitions to the dead time DT accordingly. For the dead time DT, the high side transistor M1 and the low side transistor M2 are turned off. For the dead time DT, the load current Io flows into the body diode (not shown) of the low side transistor M2 and the output voltage Vo becomes equal to about −Vf. Here, Vf refers to a forward voltage of the body diode.

At time t3 after lapse of the dead time DT, the controller 10 transitions to a third state φ3. In the third state φ3, the controller 10 turns on the third current source CS2U and the switch SW2U and increases the gate voltage VG2 of the low side transistor M2. As a result, the low side transistor M2 is turned on.

(Fourth Transition)

Figure 11:
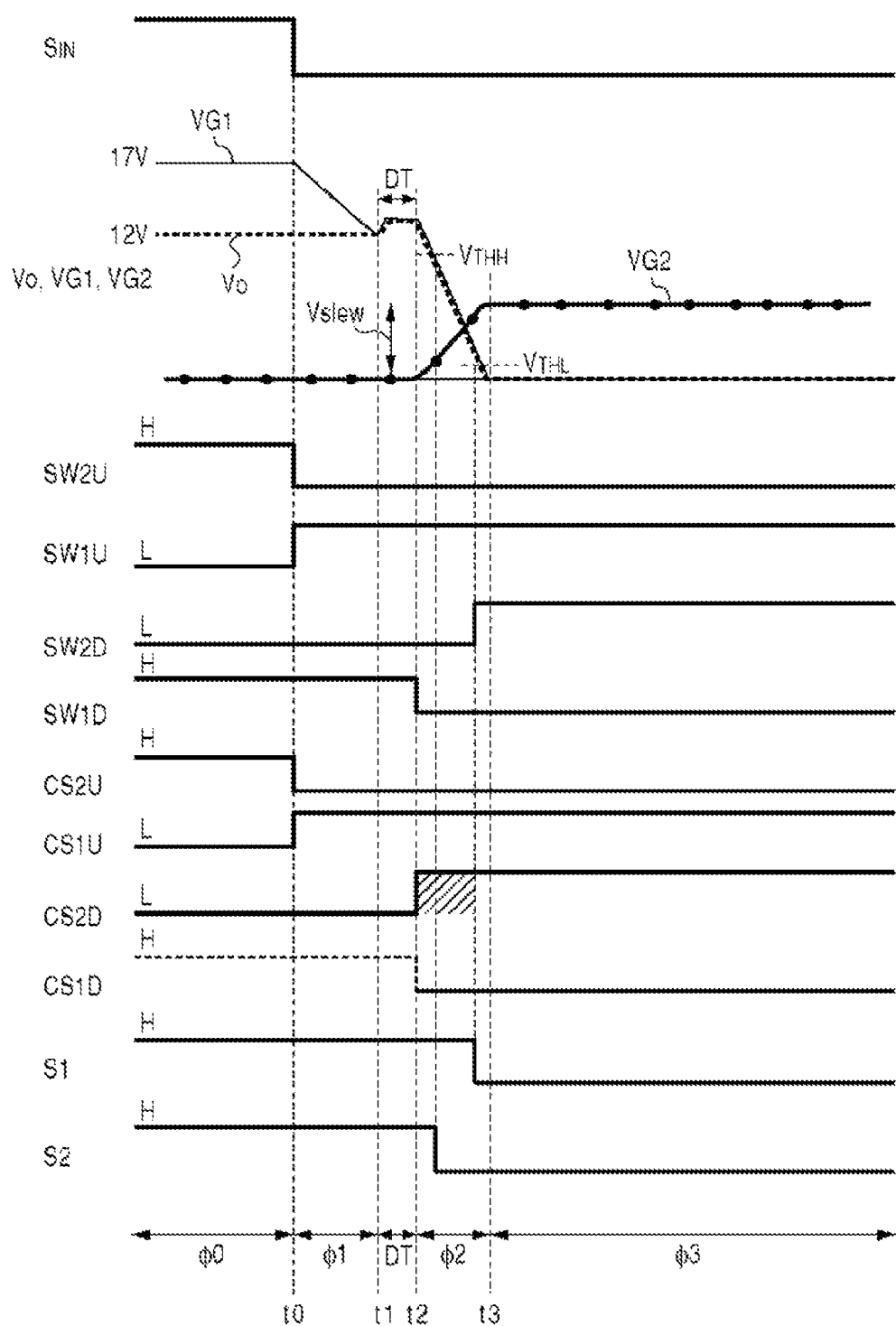
FIG. 11 is a waveform diagram showing an operation of a controller in a fourth transition.

FIG. 11 is a waveform diagram showing an operation of the controller 10 in the fourth transition. In an initial state φ0, the gate voltage VG1 is maintained at a high level voltage VDD1 and the high side transistor M1 is in the turning-on state. In addition, the gate voltage VG2 is maintained at a low level voltage VSS and the low side transistor M2 is in the turning-off state. In the initial state φ0, the controller 10 turns on the third current source CS2U and the switch SW2U in order to maintain the gate voltage VG1 as a high level.

When the control signal $S_{IN}$ transitions to the low level at time t0, the controller 10 turns off the third current source CS2U and the switch SW2U and transitions to a first state φ1. In the first state φ1, the controller 10 turns on the fourth current source CS1U and the second SW1U. At this time, the fourth current source CS1U may be turned off.

In the first state φ1, the current IU1' is drawn from the gate of the high side transistor M1 mainly by the third assist circuit 22 and the gate voltage VG1 is decreased. At this time, the output voltage Vo is kept at a high level voltage (for example, 12V).

At time t1, when it is detected that the high side transistor M1 is completely turned off, the controller 10 transitions to the dead time DT accordingly. For the dead time DT, the load current Io flows into the body diode (not shown) of the high side transistor M1 and the output voltage Vo becomes accordingly equal to about VDD1+Vf. Here, Vf refers to a forward voltage of the body diode.

At time t2 after lapse of the dead time DT, the controller 10 transitions to a second state φ2. In the second state 42, the first current source CS2D is turned on. This allows the gate voltage VG2 to be controlled by the current I2U (slew rate control). As a result, the output voltage Vo drops with a certain slope. In FIG. 11, a period for which the slew rate control is performed is hatched.

When the output voltage Vo becomes lower than the threshold voltage $V_{THL}$ at time t3, the detection signal S1 goes to a low level and transitions to a third state φ3. In the third state φ3, the controller 10 rapidly increases the gate voltage VG2 with the second assist circuit 34 (or the switch SW2D) turned on.

The bridge output circuit 100a allows the gate voltage VG2 to be lowered at a high speed by turning on the first assist circuit 32 in the first state φ1 of the first transition shown in FIG. 8. This may result in reduction in time taken until the output voltage Vo begins to increase after the control signal $S_{IN}$ transitions to the high level.

Figure 12A:
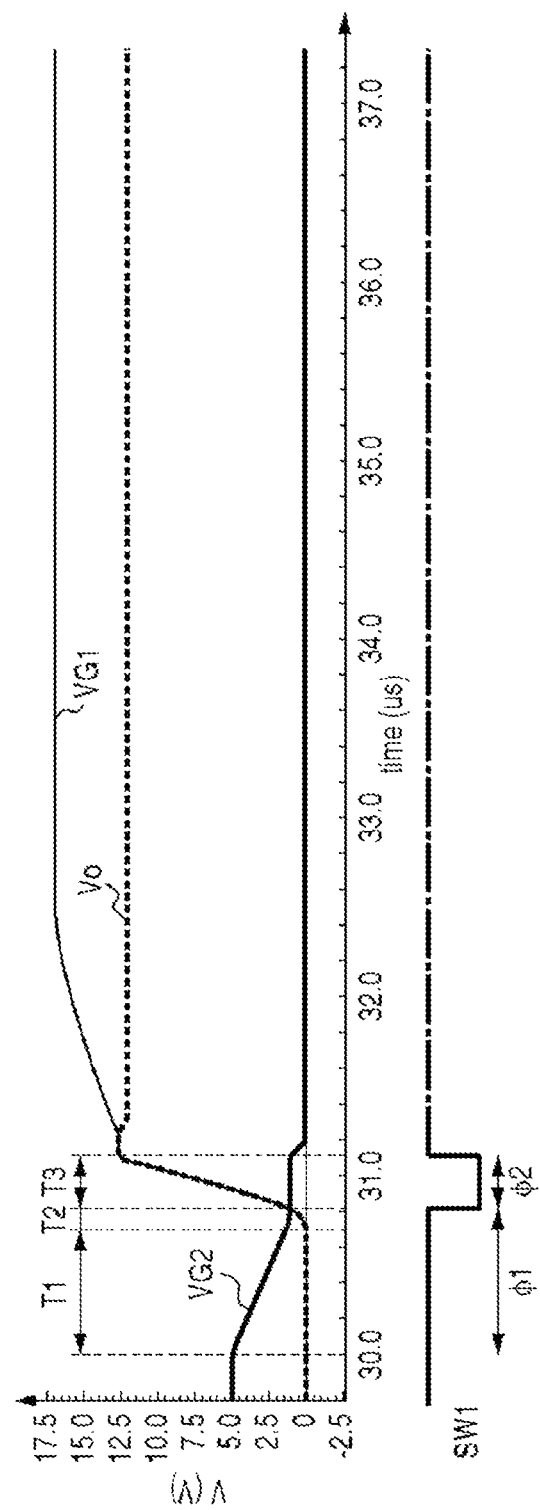
FIGS. 12A and 12B are waveform diagrams of the first transition for a case where a first assist circuit is provided and a case where the first assist circuit is not provided, respectively.
Figure 12B:
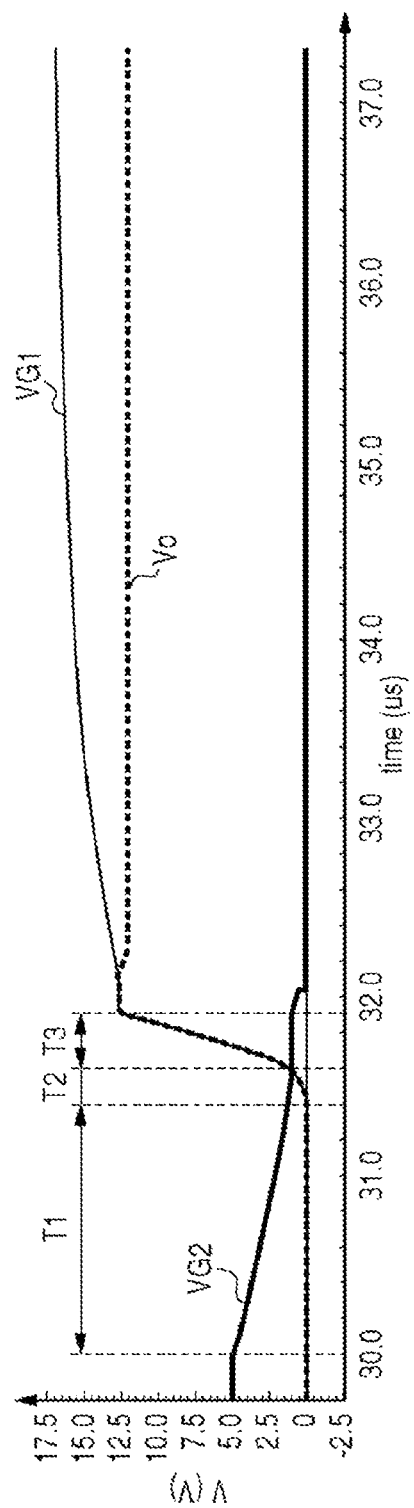

FIGS. 12A and 12B are waveform diagrams of the first transition for a case where the first assist circuit 32 is provided and a case where the first assist circuit 32 is not provided, respectively. The first assist circuit 32 allows for reduction in the period T1, which may result in reduction in time taken until the output voltage Vo begins to be changed while keeping the slew rate of the output voltage Vo constant.

Similarly, the bridge output circuit 100a allows the gate voltage VG1 to be lowered at a high speed by turning on the third assist circuit 22 in the first state φ1 of the third transition shown in FIG. 10. This may result in reduction in time taken until the output voltage Vo begins to decrease after the control signal $S_{IN}$ transitions to the low level.

Figure 13A:
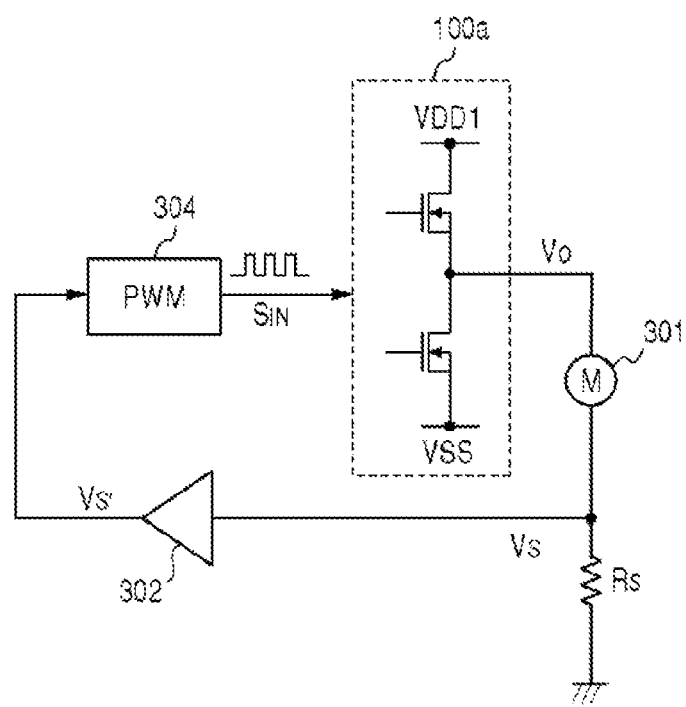
FIGS. 13A and 13B are circuit diagrams showing a configuration of a motor driving device including the bridge output circuit according to an embodiment.
Figure 13B:
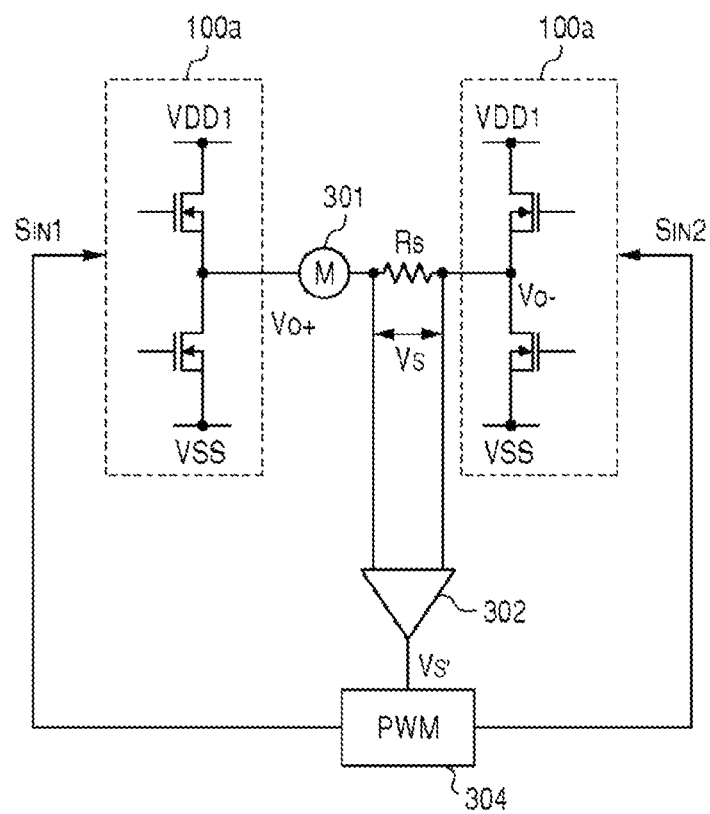

Subsequently, usage of the bridge output circuit 100a will be described. FIGS. 13A and 13B are circuit diagrams showing a configuration of a motor driving device including the bridge output circuit 100a according to the above embodiment.

A motor driving device 200a shown In FIG. 13A has a half bridge configuration and includes a current detecting circuit 202, a PWM controller 204 and the bridge output circuit 100a. A motor 201 is, for example, a voice coil motor. A detection resistor Rs is connected in series to the motor 201 and a voltage drop (detection voltage) Vs in proportion to current flowing into a coil of the motor 201 is produced across the detection resistor Rs. The current detecting circuit 202 amplifies the detection voltage Vs. The PWM controller 204 receives the amplified detection voltage Vs' from the current detecting circuit 202 and generates a pulse width modulation (PWM) signal whose duty cycle is adjusted such that the detection voltage Vs' reaches a predetermined target value. The PWM controller 204 supplies a control signal $S_{IN}$ based on the PWM signal to the bridge output circuit 100a.

A motor driving device 200b shown In FIG. 13B has a full bridge configuration (or BTL (Bridged Transless) and includes a current detecting circuit 202, a PWM controller 204 and two bridge output circuits 100a.

The motor driving devices 300a and 300b shown in FIGS. 13A and 13B can prevent generation of high frequency noises since a gradient (or slew rate) of a driving voltage Vo (Vo+ and Vo−) applied to the motor 201 can be set to a desired value. In addition, since a delay from change in the control signal $S_{IN}$ to change in the driving voltage Vo is small, power loss can be reduced and the motor 201 can be driven with high efficiency.

Figure 14A:
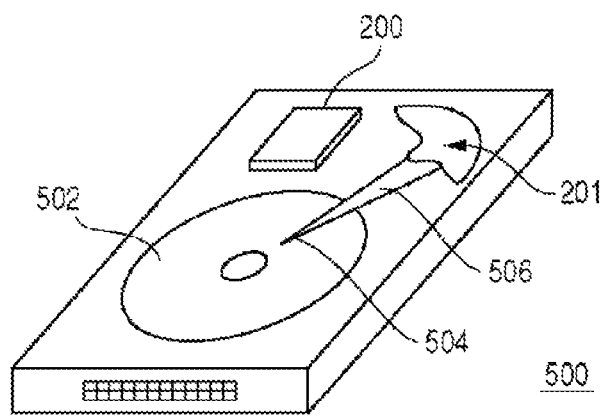
FIGS. 14A to 14C are views showing configurations of electronic apparatuses using the motor driving device of FIG. 13.
Figure 14B:
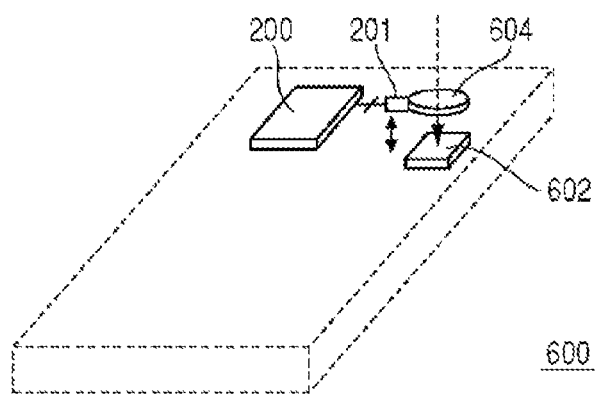
Figure 14C:
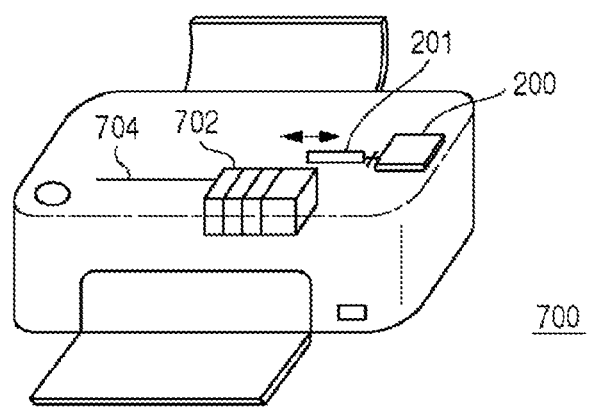

FIGS. 14A to 14C are views showing configurations of electronic apparatuses using the motor driving device 200 of FIG. 13. An electronic apparatus shown in FIG. 14A is a hard disk device 500. The hard disk device 500 includes a magnetic disk 502, a head 504 and an arm 506. The head 504 is provided to write/read data into/from the magnetic disk 502. The head 504 is attached to a leading end of the arm 506 and a relative positional relationship between the head 504 and the magnetic disk 502 is controlled by changing a position of the arm 506. The motor 201 is provided to actuate the arm 506. The motor driving circuit 200 controls the voice coil motor 201.

An electronic apparatus shown in FIG. 14B is an imaging device 600, such as a digital still camera, a digital video camera, a mobile phone or the like. The imaging device 600 includes an imaging element 602 and an auto-focus lens 604. The voice coil motor 201 performs a positioning operation for the auto-focus lens 604. The motor driving circuit 200 may be used for driving an image stabilizing lens in addition to the auto-focus lens 604.

An electronic apparatus shown in FIG. 14C is a printer 700. The printer 700 includes a head 702 and a guide rail 704. The head 702 is supported along the guide rail 704 in a positionable manner. The voice coil motor 201 controls a position of the head 702. The motor driving circuit 200 controls the voice coil motor 201. The motor driving circuit 200 may be used for driving a motor for paper feeding mechanism in addition to the head 702.

The present disclosure has been described on the basis of the particular embodiments in the above. However, these embodiments are only illustrative and it is to be understood by those skilled in the art that combinations of various elements thereof and combinations of various processes thereof may be modified in different ways and such modifications fall within the scope of the present disclosure. Some of the modifications will be described below.

(Modification 1)

Figure 15:
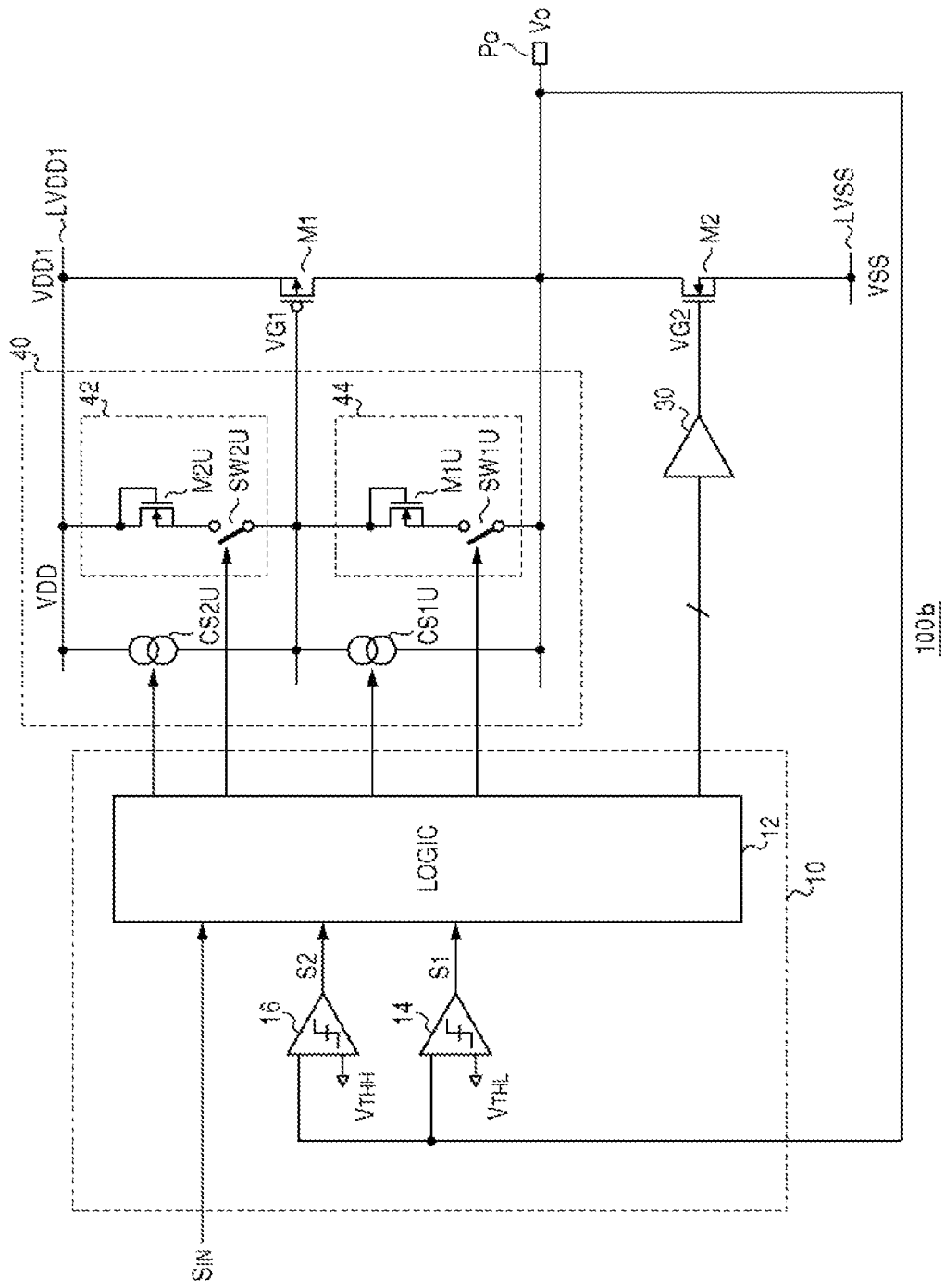
FIG. 15 is a circuit diagram of a bridge output circuit according to a first modification.

The high side transistor M1 may be a P-channel MOSFET. FIG. 15 is a circuit diagram of a bridge output circuit 100b according to a first modification. The high side transistor M1 is a P-channel MOSFET. The high side driver 40 of FIG. 15 includes a third current source CS2U, a fourth current source CS1U, a fifth assist circuit 42 and a sixth assist circuit 44. The fifth assist circuit 42 and the sixth assist circuit 44 of FIG. 15 correspond to the third assist circuit 22 and the fourth assist circuit 44 of FIG. 16, respectively. This modification can obtain the same effects as the bridge output circuit 100a.

(Modification 2)

Figure 16C:
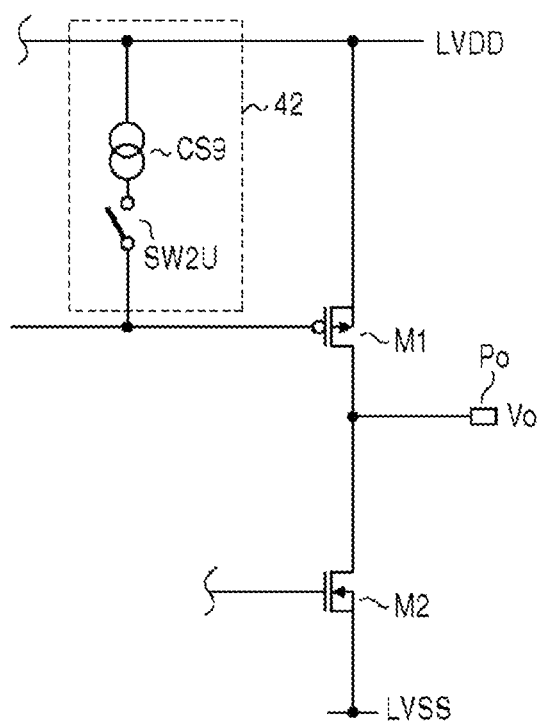

The configuration of the assist circuits 22, 32 and 42 is not limited to those described in the above. FIGS. 16A to 16C are circuit diagrams showing a modification of the first, third and fifth assist circuits 32, 22 and 42. The first assist circuit 32 includes a current source CS3 configured to switch between a turning-on state and a turning-off state. The first switch SW1D may be incorporated in the current source CS3. As shown in FIG. 16B and 16C, the same modification may be applied to the third assist circuit 22 and the fifth assist circuit 42.

(Modification 3)

The first assist circuit 32 may be configured only by the switch SW1D without providing the first transistor M1D and the current source CS3. Similarly, the third assist circuit 22 may be configured only by the second switch SW1U and the third switch SW2U, respectively.

(Modification 4)

While it has been illustrated in the above embodiment that a motor to be driven by the motor driving device 200 is the voice coil motor, usage of the motor driving device 200 is not limited thereto but the motor driving device 200 may be used for driving a spindle motor or other motors. In addition, the control scheme of the motor 201 is not limited to a feedback based on a current detection but may be either a feedback control based on a counter-electromotive force detection or an open loop control.

In addition, usage of the bridge output circuit 100a is not limited to the motor driving device 300. For example, the bridge output circuit 100a may be suitably used for a switching regulator, an inverter for lighting a discharge lamp, a digital audio amplifier or the like.

According to the present disclosure in some embodiments, it is possible to prevent variation of time at which an output voltage begins to be changed, while keeping a slew rate of the output voltage constant.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A bridge output circuit comprising:
an output terminal to be connected to a load;
a high side transistor interposed between an upper power line and the output terminal;
a low side transistor interposed between the output terminal and a lower power line, the low side transistor being an N-channel MOSFET;
a high side driver configured to control a gate voltage of the high side transistor;
a low side driver configured to control a gate voltage of the low side transistor; and
a controller configured to control the high side driver and the low side driver,
wherein the low side driver includes:
a first current source configured to switch between a turning-on state and a turning-off state and supply a first predetermined constant current to a gate of the low side transistor in the turning-on state;
a second current source configured to switch between the turning-on state and the turning-off state and draw a second predetermined constant current out of the gate of the low side transistor in the turning-on state; and
a first assist circuit configured to switch between the turning-on state and the turning-off state and draw a first auxiliary current out of the gate of the low side transistor in the turning-on state, the first assist circuit being provided separately from the second current source, and
wherein the controller is further configured to control the turning-on state and the turning-off state of the first current source, the second current source and the first assist circuit such that, when transitioning an output voltage of the output terminal from a low level voltage to a high level voltage in a state where a load current flows from the output terminal in a direction in which the load current is absorbed into the bridge output circuit, the bridge output circuit goes to a first state where the first current source is turned off and the first assist circuit is turned on, and transitions to a second state where the first current source is turned off, the second current source is turned on and the first assist circuit is turned off when the output voltage exceeds a predetermined lower threshold voltage.

2. The bridge output circuit of claim 1, wherein the first assist circuit includes a first switch interposed between the gate of the low side transistor and the lower power line, and the controller switches the first switch between the turning-on state and the turning-off state.

3. The bridge output circuit of claim 2, wherein the first assist circuit further includes a first transistor which is connected in series to the first switch to be interposed between the gate of the low side transistor and the lower power line and has a gate and a drain connected in common, and wherein the first transistor is a MOSFET (Metal Oxide Semiconductor Field Effect Transistor).

4. The bridge output circuit of claim 1, wherein the first assist circuit includes a current source which is interposed between the gate of the low side transistor and the lower power line and is configured to switch between the turning-on state and the turning-off state.

5. The bridge output circuit of claim 1, wherein the controller includes a first voltage monitoring unit configured to compare the output voltage with the predetermined lower threshold voltage, and
wherein the first voltage monitoring unit includes a second transistor, which has a source connected to the lower power line and a gate to which the output voltage is applied, and a pull-up resistor, which is interposed between a drain of the second transistor and a predetermined voltage line and outputs a signal based on a drain voltage of the second transistor as a detection signal indicating a result of the voltage comparison, and wherein the second transistor is an N-channel MOSFET.

6. The bridge output circuit of claim 1, wherein the low side driver further includes a second assist circuit configured to switch between the turning-on state and the turning-off state and to supply a second auxiliary current to the gate of the low side transistor in the turning-on state, the second assist circuit being provided separately from the first current source, and wherein the controller is further configured to control the turning-on state and the turning-off state of the second assist circuit.

7. A motor driving device comprising a bridge output circuit of claim 1.

8. An electronic apparatus comprising:
a motor; and
a motor driving device configured to drive the motor,
wherein the motor driving device includes a bridge output circuit of claim 1.

9. A bridge output circuit comprising:
an output terminal to be connected to a load;
a high side transistor interposed between an upper power line and the output terminal, the high side transistor being an N-channel MOSFET;
a low side transistor interposed between the output terminal and a lower power line;
a high side driver configured to control a gate voltage of the high side transistor;
a low side driver configured to control a gate voltage of the low side transistor; and
a controller configured to control the high side driver and the low side driver,
wherein the high side driver includes:
a third current source configured to switch between a turning-on state and a turning-off state and supply a first predetermined constant current to a gate of the high side transistor in the turning-on state;
a fourth current source configured to switch between the turning-on state and the turning-off state and draw a second predetermined constant current out of the gate of the high side transistor in the turning-on state; and
a third assist circuit configured to switch between the turning-on state and the turning-off state and draw a first auxiliary current out of the gate of the high side transistor in the turning-on state, the third assist circuit being provided separately from the fourth current source, and
wherein the controller is further configured to control the turning-on state and the turning-off state of the third current source, the fourth current source and the third assist circuit such that, when transitioning an output voltage of the output terminal from a high level voltage to a low level voltage in a state where a load current flows from the output terminal in a direction in which the load current is discharged to the load, the bridge output circuit goes to a first state where the third current source is turned off and the third assist circuit is turned on, and transitions to a second state where the third current source is turned off, the fourth current source is turned on and the third assist circuit is turned off when the output voltage is lower than a predetermined upper threshold voltage.

10. The bridge output circuit of claim 9 wherein the third assist circuit includes a second switch interposed between the gate of the high side transistor and the output terminal, and the controller switches the second switch between the turning-on state and the turning-off state.

11. The bridge output circuit of claim 10, wherein the third assist circuit further includes a third transistor which is connected in series to the second switch to be interposed between the gate of the high side transistor and the output terminal and has a gate and a drain connected in common, and wherein the third transistor is a MOSFET (Metal Oxide Semiconductor Field Effect Transistor).

12. The bridge output circuit of claim 9, wherein the third assist circuit includes a current source which is interposed between the gate of the high side transistor and the output terminal and is configured to switch between the turning-on state and the turning-off state.

13. The bridge output circuit of claim, 9 wherein the controller includes a second voltage monitoring unit configured to compare the output voltage with the predetermined upper threshold voltage, and
wherein the second voltage monitoring unit includes a fourth transistor, which has a source connected to the upper power line and a gate to which the output voltage is applied, and a pull-down resistor, which is interposed between a drain of the fourth transistor and a predetermined voltage line and outputs a signal based on a drain voltage of the fourth transistor as a detection signal indicating a result of the voltage comparison, and wherein the fourth transistor is a P-channel MOSFET.

14. The bridge output circuit of claim 9, wherein the high side driver further includes a fourth assist circuit configured to switch between the turning-on state and the turning-off state and supply a second auxiliary current to the gate of the high side transistor in the turning-on state, the fourth assist circuit being provided separately from the third current source, and the controller is configured to further control the turning-on state and the turning-off state of the fourth assist circuit.

15. A bridge output circuit comprising:
an output terminal to be connected to a load;
a high side transistor interposed between an upper power line and the output terminal, the high side transistor being a P-channel MOSFET;
a low side transistor interposed between the output terminal and a lower power line;
a high side driver configured to control a gate voltage of the high side transistor;
a low side driver configured to control a gate voltage of the low side transistor; and
a controller configured to control the high side driver and the low side driver,
wherein the high side driver includes:
a fifth current source configured to switch between a turning-on state and a turning-off state and supply a first predetermined constant current to a gate of the high side transistor in the turning-on state;
a sixth current source configured to switch between the turning-on state and the turning-off state and draw a second predetermined constant current out of the gate of the high side transistor in the turning-on state; and
a fifth assist circuit configured to switch between the turning-on state and the turning-off state and draw a first auxiliary current out of the gate of the high side transistor in the turning-on state, the fifth assist circuit being provided separately from the fifth current source, and wherein the controller is further configured to control the turning-on state and the turning-off state of the fifth current source, the sixth current source and the fifth assist circuit such that, when transitioning an output voltage of the output terminal from a high level voltage to a low level voltage in a state where a load current flows from the output terminal in a direction in which the load current is discharged to the load, the bridge output circuit goes to a first state where the sixth current source is turned off and the fifth assist circuit is turned on, and transitions to a second state where the sixth current source is turned off, the fifth current source is turned on and the fifth assist circuit is turned off when the output voltage is lower than a predetermined upper threshold voltage.

16. The bridge output circuit of claim 15, wherein the fifth assist circuit includes a third switch interposed between the gate of the high side transistor and the upper power line, and the controller switches the third switch between the turning-on state and the turning-off state.

17. The bridge output circuit of claim 16, wherein the fifth assist circuit further includes a fifth transistor which is connected in series to the third switch to be interposed between the gate of the high side transistor and the upper power line and has a gate and a drain connected in common, and wherein the fifth transistor is a MOSFET (Metal Oxide Semiconductor Field Effect Transistor).

18. The bridge output circuit of claim 16, wherein the fifth assist circuit includes a current source which is interposed between the gate of the high side transistor and the upper power line and is configured to switch between the turning-on state the turning-off state.

19. The bridge output circuit of claim 15, wherein the controller includes a second voltage monitoring unit configured to compare the output voltage with the predetermined upper threshold voltage, and wherein the second voltage monitoring unit includes a fourth transistor, which has a source connected to the upper power line and a gate to which the output voltage is applied, and a pull-down resistor, which is interposed between a drain of the fourth transistor and a predetermined voltage line and outputs a signal based on a drain voltage of the fourth transistor as a detection signal indicating a result of the voltage comparison, and wherein the fourth transistor is a P-channel MOSFET.

20. The bridge output circuit of claim 15, wherein the high side driver further includes a sixth assist circuit configured to switch between the turning-on state and the turning-off state and draw a second auxiliary current out of the gate of the high side transistor in the turning-on state, the sixth assist circuit being provided separately from the sixth current source, and the controller is further configured to control the turning-on state and the turning-off state of the sixth assist circuit.

* * * * *